United States Patent
Dhong et al.

(10) Patent No.: US 6,172,920 B1
(45) Date of Patent: Jan. 9, 2001

(54) DATA TRANSFER USING TWO-STAGE BIT SWITCH IN MEMORY CIRCUIT

(75) Inventors: Sang Hoo Dhong, Austin, TX (US); Manabu Ohkubo; Shohji Onishi, both of Shiga (JP); Osamu Takahashi, Round Rock, TX (US)

(73) Assignee: International Business Machines Corporation, Armonk, NY (US)

( * ) Notice: Under 35 U.S.C. 154(b), the term of this patent shall be extended for 0 days.

(21) Appl. No.: 09/498,087

(22) Filed: Feb. 4, 2000

(51) Int. Cl.⁷ ........................................ G11C 7/12
(52) U.S. Cl. .................. 365/190; 365/208; 365/207; 365/196; 365/203; 365/204
(58) Field of Search .................... 365/190, 205, 365/207, 208, 196, 233, 203, 204

(56) References Cited

U.S. PATENT DOCUMENTS 5,742,545 * 4/1998 Kato ...................................... 365/190

5,983,314 * 11/1999 Merritt ................................. 711/105

* cited by examiner

Primary Examiner—Andrew Q. Tran
(74) Attorney, Agent, or Firm—Casimer K. Salys; Felsman, Bradley, Vaden, Gunter & Dillon, LLP

(57) ABSTRACT

A data transfer circuit for read data operations in a memory circuit employs a two-stage bit switch. True and compliment bit lines from a memory cell array are coupled to gates of a pair of transistors in a first stage bit switch. The data from the bit lines is thus transferred to a pair of read data nodes without a DC connection, so charge-sharing is avoided. Also, this allows the data to be extracted without a full logic-level swing of the bit lines, so faster operation is provided. The data from the data nodes is transferred to a pair of data lines through a second-stage bit switch activated by a timing input. The differential voltage on the bit lines is enhanced by a sense amplifier, and, also, the use of the first-stage bit switch allows the bit lines to be precharged to only half the logic level, speeding up operation; this sense amplifier is activated before the timing input for the second-stage bit switch. The data lines are precharged then selectively discharged through source-to-drain paths of the transistors of the first and second stage bit switches.

10 Claims, 2 Drawing Sheets

DATA TRANSFER USING TWO-STAGE BIT SWITCH IN MEMORY CIRCUIT

BACKGROUND OF THE INVENTION

1. Technical Field

This invention relates to data transfer circuits in memory devices or the like, and more particularly to a two-stage bit switch for transferring data between bit lines in a memory device to data lines for output in a read operation.

2. Description of the Related Art

In a memory device of the type having an array of a large number of memory cells on a semiconductor chip, a read operation employs a pair of true and complement bit lines for a column of cells in the array, wherein the data on these bit lines is sensed and transferred to output circuitry. One of the ways to achieve high performance in these memory devices is to speed up this transfer of data in a read operation.

In some prior circuits used in transferring data from bit lines to output circuitry in a read operation, a direct connection between the bit lines and read data lines created a charge sharing problem, whereby data may possibly be read incorrectly. Thus, in order to avoid this charge sharing issue, it is preferred to couple the data on the bit lines to read data output circuitry by a path that does not permit direct currents to flow between the bit lines and the read data lines.

In prior arrangements for read data operations in memory circuits of this type, optimum speed is not achieved because of the time needed in a read operation to transfer data from the bit lines to the read data lines, a problem resulting in part from the delay needed to allow the bit lines to separate or develop a voltage differential large enough for unequivocal sensing in downstream circuitry in the read arrangement. Thus, it is preferable to enable sensing at an earlier point in the cycle of the read operation than has previously been allowed.

SUMMARY OF THE INVENTION

It is therefore one object of the present invention to provide an improved method of transferring data from bit lines in a read operation in a memory device.

It is another object of the present invention to provide an improved high speed data transfer circuit in a memory device, for moving data between bit lines of the memory array and data lines in a read-data output circuit.

It is yet another object of the present invention to provide improved performance in read data operations in memory devices by speeding up the generation of data in the read circuit at logic levels permitting sensing at earlier times in the cycle, while at the same time avoiding charge sharing issues.

The above as well as additional objects, features, and advantages of the present invention will become apparent in the following detailed written description.

According to one embodiment of the invention, a data transfer circuit for read data operations in a memory circuit employs a two-stage bit switch. True and complement bit lines from a memory cell array are coupled to gates of a pair of transistors in a first stage bit switch. The data from the bit lines is thus transferred to a pair of read data nodes without a DC connection, so charge-sharing is avoided. Also, this allows the data to be extracted without a full logic-level swing of the bit lines, so faster operation is provided. The data from the data nodes is transferred to a pair of data lines through a second-stage bit switch activated by a timing input. The differential voltage on the bit lines is enhanced by a sense amplifier, and, also, the use of the first-stage bit switch allows the bit lines to be precharged to only half the logic level, speeding up operation; this sense amplifier is activated before the timing input for the second-stage bit switch. The data lines are precharged then selectively discharged through source-to-drain paths of the transistors of the first and second stage bit switches

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment, when read in conjunction with the accompanying drawings, wherein:

DETAILED DESCRIPTION OF PREFERRED EMBODIMENT

Figure 1:
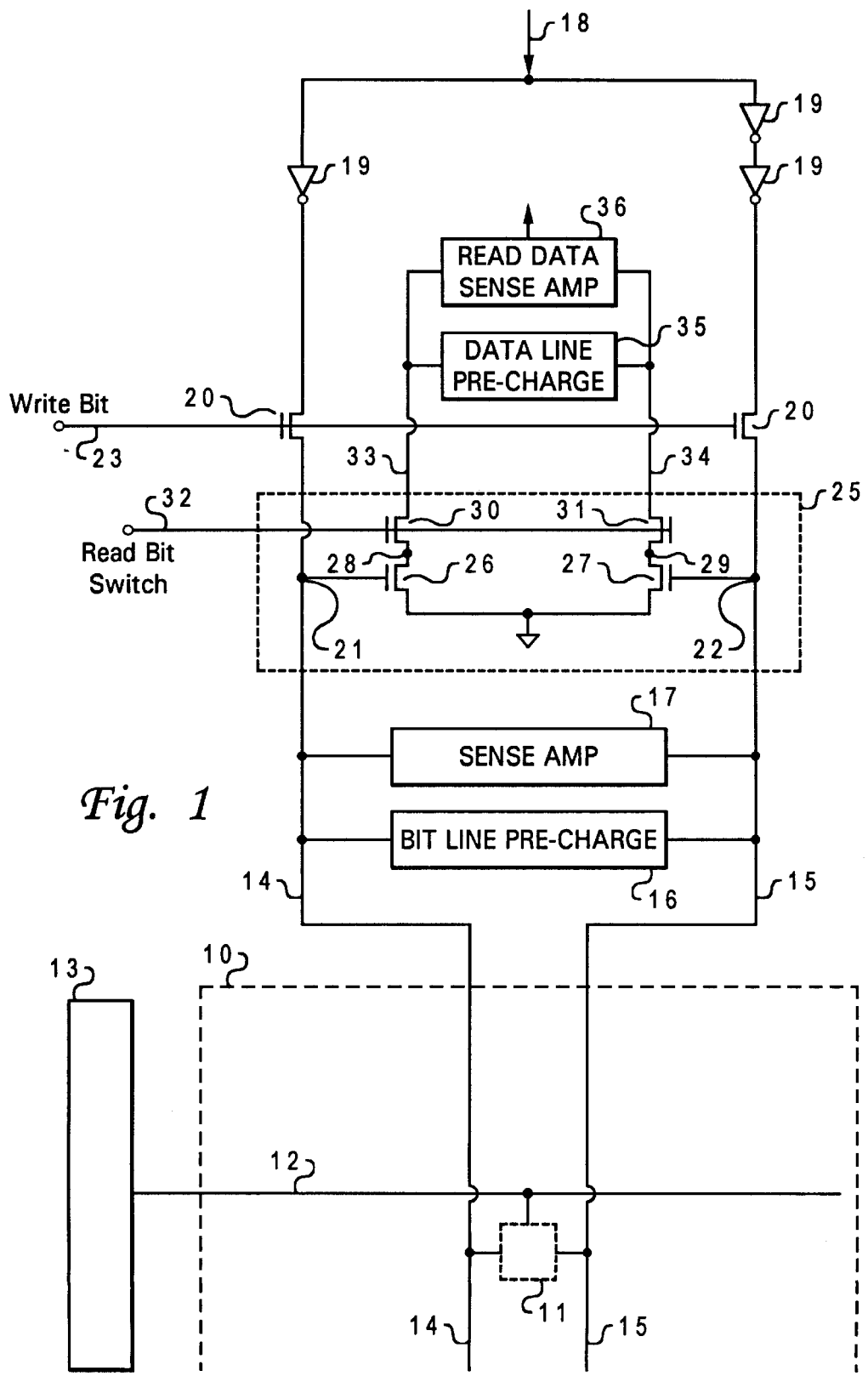
FIG. 1 is an electrical diagram of a part of a memory device, showing a two-stage switch circuit having features of one embodiment of the present invention.

With reference to FIG. 1, a memory circuit is shown employing features of the invention. A memory array 10 formed on a semiconductor chip contains a large number of memory cells 11, in this illustration static memory cells. A word line 12 selects one of the rows of memory cells in the array 10 for read/write operations, based on an address applied to a row decoder 13. Each column of memory cells has a bit line 14 and a complement bit line 15. When selected by the word line 12, one cell in a column will be connected to the bit line pair 14, 15 for writing data into the cell or reading data from the cell.

Connected to the bit line pair 14, 15 for each column of cells is a bit line precharge circuit 16 which functions to precharge the bit line pair 14, 15 to one-half the supply voltage before a read or write cycle. Also connected to each bit line pair in the array 10 is a sense amplifier 17 functioning to detect the slight voltage change on the bit line pair at the initial stage of a read cycle and to accelerate the switch to a full logic level difference between the voltage on one of the bit lines 14, 15 compared to the other.

Write data is applied to the true and complement bit line pair 14, 15 from a write data line 18 and invertors 19. A column decoder selects one of the columns of cells of the array 10 for writing. A write bit switch 20 connects the invertor outputs to nodes 12 and 22 when write bit signal 23 is activated. If the write bit signal is not activated, the nodes 21 and 22 are isolated from the invertor outputs and so are available for a read operation.

According to the invention, a two-stage bit switch 25 is employed for read operations. A first stage is formed by transistors 26 and 27 which have their gates driven by the bit line pair 14, 15. These transistors 26 and 27 drive intermediate data-line nodes 28 and 29. The second stage is made up of a pair of transistors 30 and 31 having gates driven by a read bit switch line 32 an having source-drain paths connected to true and complement data lines 33 and 34. A precharge circuit 35 initially precharges these data lines before a read cycle begins; this precharge could be to one-half Vdd also, but a full Vdd is used to provide better noise margins. The data lines 33, 34 are connected to a read sense amp 36 functioning to detect the voltage difference beginning to develop between the true and complement data lines and to drive it to a full logic level.

Figure 2:
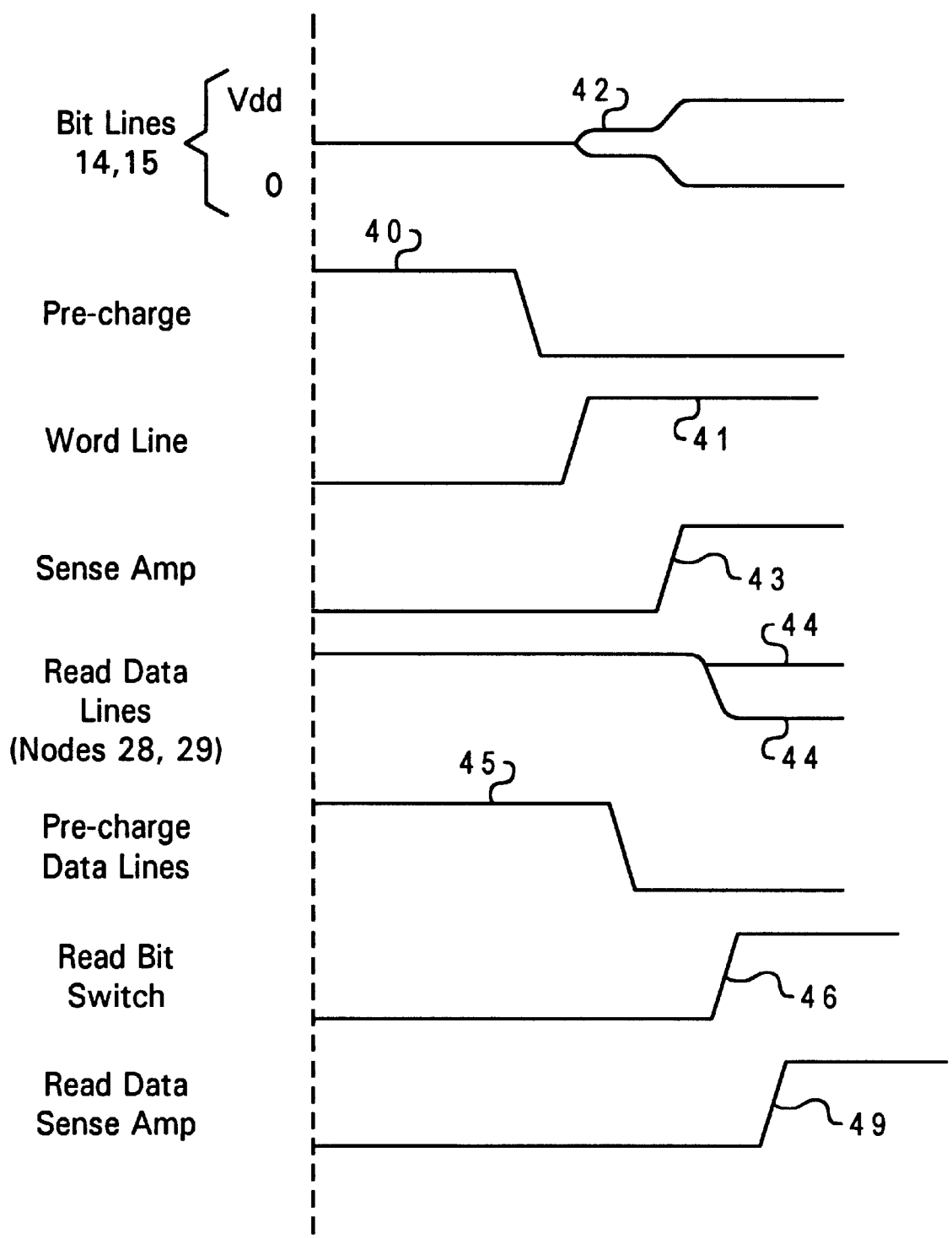
FIG. 2 is a timing diagram of various voltages and events occurring in the circuit of FIG. 1, appearing as a graph of voltage vs. time.

In operation, referring now to FIG. 1 and to the timing diagram of FIG. 2, first the true and complement bit line pairs 14, 15 of all columns in the array 10 are precharged to a half Vdd level by the bit line precharge circuits 16, when precharge signal 40 is high. After one of the cells 11 is selected by a signal 41 on a read word line 12 by decoder 13, the differential voltage between the true and complement bit lines 14, 15 starts to develop as seen at 42. Then the sense amplifier 17 is enabled by signal 43, enabling the faster development of a differential voltage 44 at the bit line pair 14, 15. The high-state one of the bit lines 14, 15 keeps one of the transistors 26 or 27 in the first stage switch activated and the low-state bit line deactivates the other of the transistors 26, 27, so nodes 28 and 29 will go toward full logic level differential, seen at 44. The read data lines 33, 34 are initially precharged high by signal 45. After the read bit switch signal 46 on line 32 activates the second stage read switches 30 and 31, one of the read data line pair 33 or 34 which is on the same side as with the activated first stage switch transistor 26 or 27 starts to fall in voltage level, toward Vss. The other one of the read data line pair 33 or 34 stays high because there is no path to discharge the precharge on that line. Then the read data sense amplifier 36 is activated by a signal 49, helping the further development of differential voltage between the read data line pair 37, 38.

The advantages to using the two stage bit switch arrangement or the invention are twofold. First, the potential of the high state bit line 14 or 15 only needs to be larger than the threshold voltage of the first stage switch transistors 26 and 27. Therefore, the sense amplifier 17 only needs to develop a smaller differential voltage than the conventional approach which requires rail-to-rail voltage development. For example, the differential voltage between the bit-line pair 14, 15 can be just half Vdd, even including some noise margins. The time required to develop the half Vdd differential voltage is considerably shorter than that for the rail-t-rail case. This is particularly true in a memory circuit, considering the bit lines 14, 15 are heavily loaded with the many devices in the memory cell array 10 and fall very slowly. Since the high state of the bit line does not have to be full Vdd, both the bit lines 4, 15 do not have to be precharged to Vdd. Again, for example, they could be precharged to half Vdd. The time required to precharge the bit lines to half Vdd is considerably shorter than that for the case of full Vdd precharge. Overall, the features of the invention as seen in FIGS. 1 and 2 enables a faster read operation.

Secondly, an advantage of the invention is that the bit lines 14, 15 are connected to gates of the first stage switch transistors 26 and 27, and so there is no direct current path between the bit lines 14, 15 and the data lines 37, 38. As a result, there is less chance for the occurrence of charge sharing problems than in the cases of conventional one-stage switch approaches. The approach in this invention reduces the risk of reading the data incorrectly due to charge sharing.

While the invention has been shown and described with reference to a particular embodiment, it will be understood that various changes in form and detail of the preferred embodiment, as well as other embodiments of the invention, may be made by those skilled in the art without departing from the true spirit and scope of the invention.

What is claimed is:

1. A data transfer circuit for a memory device of the type having a pair of true and complement bit lines in an array of memory cells, comprising:
    a first stage switching circuit including a first pair of transistors having gates coupled to said pair of bit lines and having source-drain paths connected to a pair of data nodes;
    a second stage switching circuit including a second pair of transistors having gates connected to a timing input and having source-drain paths connected between a pair of data lines and said data nodes;
    a sensing circuit connected to said data lines and generating a data output.

2. A circuit according to claim 1 including a sense amplifier connected to said bit lines and actuated in a read cycle before said timing input.

3. A circuit according to claim 2 wherein said data lines are precharged and are discharged through said source-drain paths of said first and second pairs of transistors.

4. A circuit according to claim 3 wherein said sensing circuit is activated after said timing input.

5. A circuit according to claim 4 including means for precharging said bit lines to about half of a logic level for said memory cells of said array.

6. A method of transferring data in a memory device of the type having a pair of true and complement bit lines in an array of memory cells, comprising the steps of:
    coupling data from said bit lines to a pair of data nodes via gates of a first stage switching circuit including a first pair of transistors;
    coupling data from said data nodes to a pair of data lines via a second stage switching circuit including a second pair of transistors having gates connected to a timing input and having source-drain paths connected between said pair of data lines and said data nodes;
    sensing data on said data lines via a sensing circuit connected to said data lines, and generating a data output.

7. A method according to claim 6 including sensing and amplifying data on said bit lines in a read cycle before said timing input.

8. A method according to claim 7 including precharging said data lines and allowing said data lines to tend to selectively discharge through source-drain paths of said first and second pairs of transistors.

9. A method according to claim 8 including activating said sensing circuit after said timing input.

10. A method according to claim 9 including precharging said bit lines to about half of a logic level for said memory cells of said array.

* * * * *